United States Patent
Lee

(12) United States Patent (10) Patent No.: US 7,488,968 B2
Lee (45) Date of Patent: Feb. 10, 2009

(54) MULTILEVEL PHASE CHANGE MEMORY

(75) Inventor: Jong-Won S. Lee, San Francisco, CA (US)

(73) Assignee: Ovonyx, Inc., Rochester Hills, MI (US)

( * ) Notice: Subject to any disclaimer, the term of this patent is extended or adjusted under 35 U.S.C. 154(b) by 37 days.

(21) Appl. No.: 11/122,363

(22) Filed: May 5, 2005

(65) Prior Publication Data

US 2006/0249725 A1 Nov. 9, 2006

(51) Int. Cl.
*H01L 47/00* (2006.01)
(52) U.S. Cl. ............... 257/4; 257/2; 257/3; 257/7; 257/5; 257/6; 257/296; 365/148
(58) Field of Classification Search ......... 257/2, 257/3, 4, 5, 6, 7, 296; 365/148
See application file for complete search history.

(56) References Cited

U.S. PATENT DOCUMENTS 7,042,001 B2 * 5/2006 Kim et al. ................ 257/3
2003/0052351 A1 * 3/2003 Xu et al. ................. 257/296
2003/0219924 A1 * 11/2003 Bez et al. ................. 438/102
2005/0032319 A1 * 2/2005 Dodge ..................... 438/293
2005/0112896 A1 * 5/2005 Hamann et al. ........... 438/694

* cited by examiner

*Primary Examiner*—Evan Pert
*Assistant Examiner*—Tan N Tran
(74) *Attorney, Agent, or Firm*—Trop, Pruner & Hu, P.C.

(57) ABSTRACT

A multilevel phase change memory may be formed of a chalcogenide material formed between a pair of spaced electrodes. The cross-sectional area of the chalcogenide material may decrease as the material extends from one electrode to another. As a result, the current density decreases from one electrode to the other. This means that a higher current is necessary to convert the material that has the largest cross-sectional area. As a result, different current levels may be utilized to convert different amounts of the chalcogenide material to the amorphous or reset state. A distinguishable resistance may be associated with each of those different amounts of amorphous material, providing the opportunity to engineer a number of different current selectable programmable states.

14 Claims, 3 Drawing Sheets

MULTILEVEL PHASE CHANGE MEMORY

BACKGROUND

This invention relates generally to phase change memories and, particularly, to multilevel phase change memories.

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

While conventional phase change memories are two level memory cells, there is a need for phase change memories with multiple levels including three or more levels or states.

DETAILED DESCRIPTION

Figure 1:
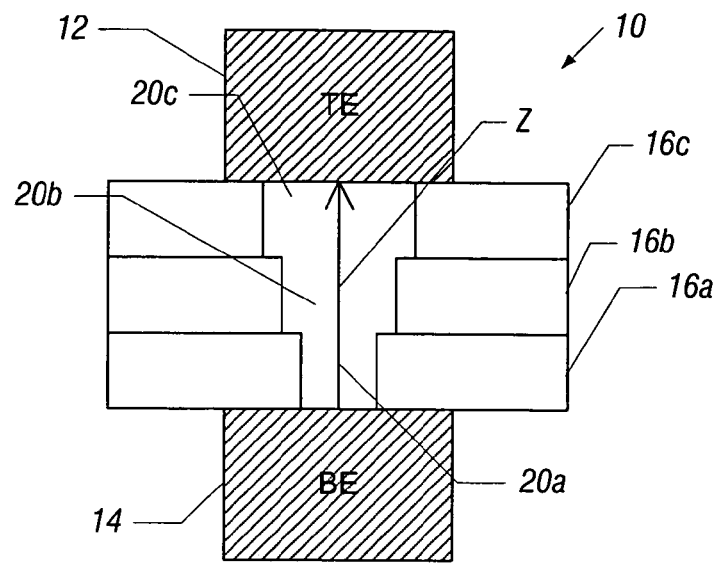
FIG. 1 is an enlarged, cross-sectional view through one embodiment of the present invention.

Referring to FIG. 1, a phase change memory cell 10 may include a bottom electrode 14 and a top electrode 12. The terms bottom and top are simply arbitrary and what is called for are two spaced electrodes with an intervening chalcogenide material 20.

As illustrated in FIG. 1, the cross-sectional area of the chalcogenide material 20 (the direction transverse to the direction indicated by the arrow Z) expands as the cell 10 extends from the bottom electrode 14 to the top electrode 12. In the embodiment illustrated, the cross-sectional area of the chalcogenide material 20 expands in discrete steps. Each step may be represented by cylindrical regions 20a, 20b, 20c that increase in diameter. In other embodiments, the chalcogenide material 20 may expand linearly or pursuant to any other geometric relationship. Thus, in some embodiments, the material 20 may be shaped as the series of increasing diameter cylinders 20a, 20b, 20c, illustrated as a cone, or any other desirable increasing cross-sectional area shape.

In the illustrated embodiment, a series of layers 16a-16c are associated with and surround each of the phase change regions 20a-20c. In some embodiments, the layer 16c may have the highest heat transfer coefficient and the layer 16a may have the lowest.

Potentials may be applied to the electrodes 14 and 12 that cause current flow through the chalcogenide material 20. This current flow may induce a phase change in some number of the regions 20a-20c.

Figure 2A:
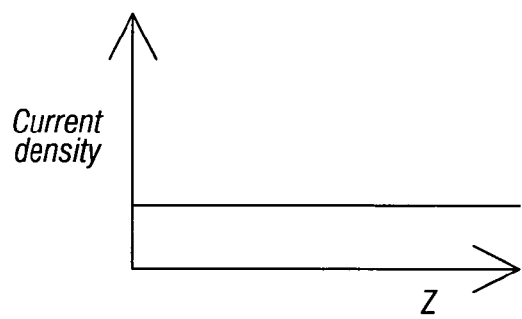
FIG. 2A shows a hypothetical current density through the region 16c of the memory shown in FIG. 1 in accordance with one embodiment of the present invention.
Figure 2B:
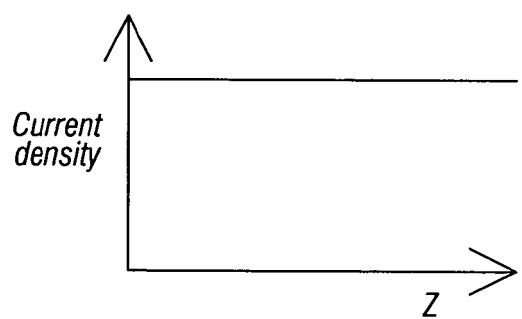
FIG. 2B shows a hypothetical current density for the region 16a in accordance with one embodiment of the present invention.

Because of the increasing diameter of the chalcogenide material 20, the current density is lowest in the region 20c proximate to the layer 16c, as indicated in FIG. 2A, and highest in the region 20a proximate to the layer 16a, as shown in FIG. 2B. This is because current density is a function of area transverse to the direction of current flow.

Figure 3:
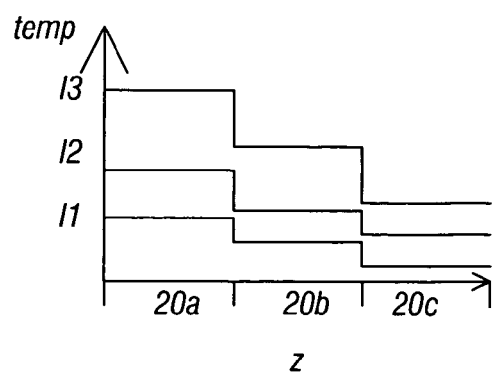
FIG. 3 is a hypothetical plot of temperature versus distance between the bottom and top electrodes in accordance with one hypothetical embodiment of the present invention.

As shown in FIG. 3, in an embodiment with three different current levels I1-I3, the temperature along the direction of the arrow Z steps down from being the highest in the region 20a to the lowest in the region 20c. In some embodiments, this may be a function of the different current densities in each of the regions 20a-20c. In other embodiments, it is a combination of the effect of the current densities of the regions 20a-20c being different (due to their different sizes in the direction transverse to the direction Z), combined with different coefficients of heat transfer of the layers 16a-16c. In some embodiments, the layer 16c transfers the most heat, while the layer 16a transfers the least heat.

Figure 4:
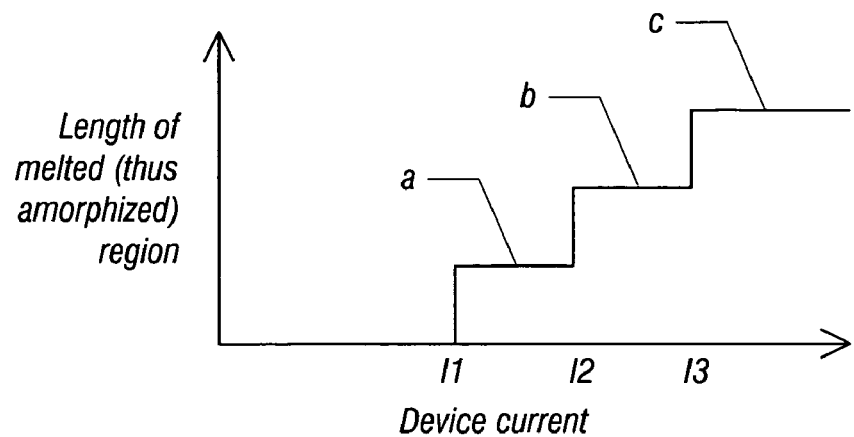
FIG. 4 is a hypothetical plot of the length of the melted region versus device current for the embodiment shown in FIG. 1.

Thus, referring to FIG. 4, the length of the melted or phase changed region in response to current flow increases with device current in steps a-c corresponding to the stepped regions 20a-20c. The steps a-c may be associated with different measurable resistances, R1, R2, and R3, that may indicate different program states, as indicated in FIG. 5.

In some embodiments of the present invention, by providing increasingly greater current flow, an increasingly greater amount of the phase change material 20 is converted from the set to the reset state. The set state may correspond to the crystalline structure of the chalcogenide 20 and the reset state may correspond to the amorphous phase. Because of the lower current density in the region 20c, (as well as the greater heat transfer coefficient of the layer 16c, in some embodiments), a relatively high current density corresponding to the highest current level I3 in the embodiment illustrated may be necessary to convert the region 20c.

Figure 5:
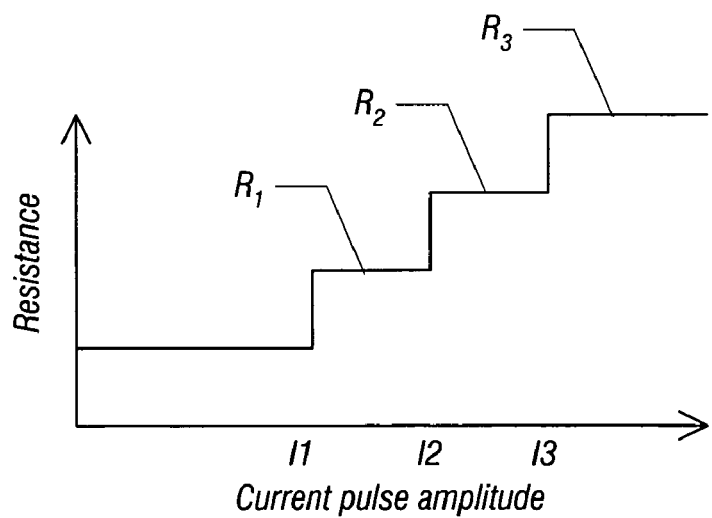
FIG. 5 is a hypothetical plot of resistance versus current pulse amplitude for the embodiment shown in FIG. 1 in accordance with one embodiment of the present invention.
Figure 6:
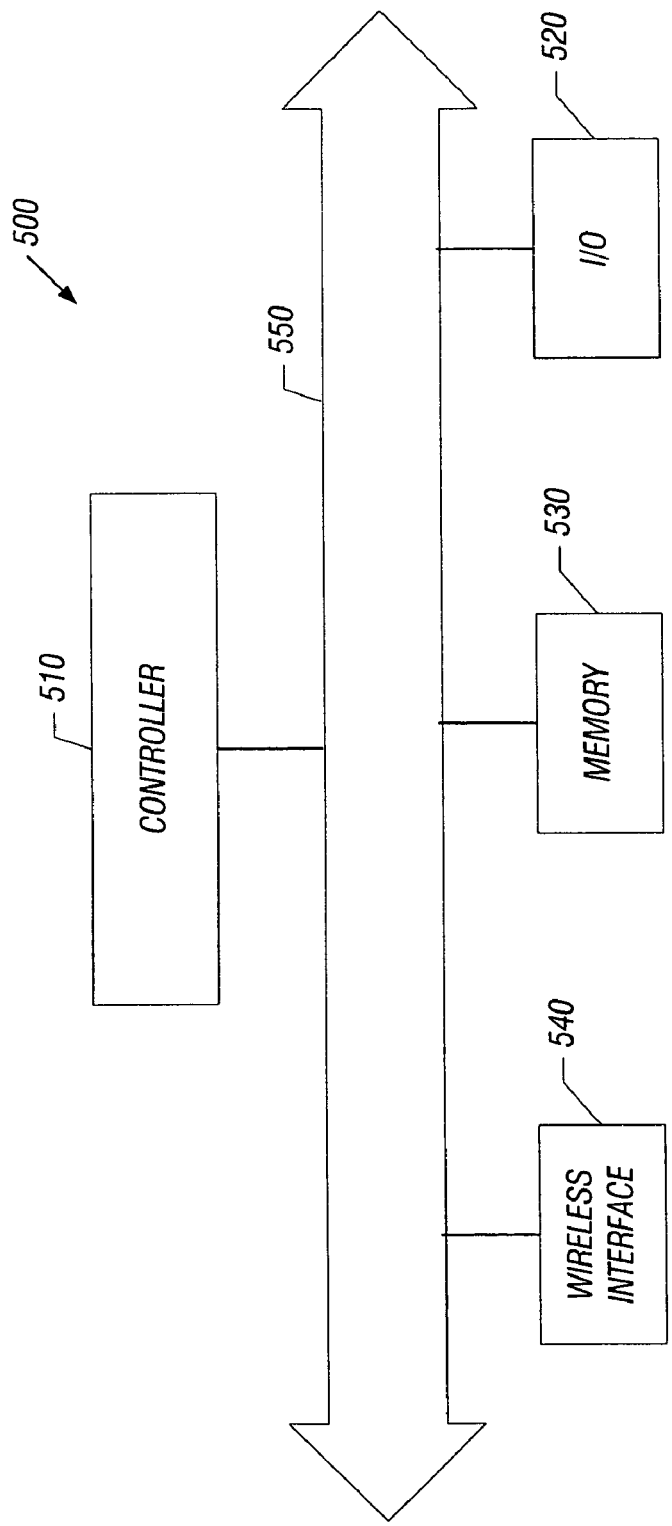
FIG. 6 is a system depiction for one embodiment of the present invention.

As shown in FIG. 5, the resistance increases in steps to the maximum resistance when the current level I3 is provided, which may substantially completely convert all three regions 20a, 20b, and 20c, to the reset state. Conversely, in some embodiments, the current level I2 may convert only the regions 20a and 20b, while only the region 20a may be converted by the lowest current level I1.

Thus, in the embodiment illustrated with three regions 20a-20c, four different phase change memory levels may be formed. Those levels correspond to the currents levels I1-I3, which correspond to three different amorphous regions. The three different amorphous regions may be associated with different measurable resistivity levels. In addition, a fourth level corresponds to the completely crystalline state of the chalcogenide material 20.

Some designers may prefer to design the phase change memory device to give more resistance range for the available current range. More programmable levels can be obtained by simply providing more electrically distinguishable regions of the material 20 or more steps of the layers 16a-16c or combinations thereof.

Thus, to program one level, the current level I1 is applied, to program a second level, the current level I2 is applied, and to program the third amorphous layer, the current level I3 may be applied. With no current, the cell 10 may remain in a crystalline default state, in one embodiment of the present invention, called the set state. However, other nomenclatures and other arrangements of multilevel cell states may be implemented according to some embodiments of the present invention.

In order to form the structure shown in FIG. 1, the bottom electrode 14 may be formed in a dielectric layer over a semiconductor substrate. Then, the stack of layers 16a-16c may be formed and a hole formed down the middle, for example, using a directional etch. Then, the stack of layers 16a-16c can be exposed to anisotropic etching gases. If the layers 16 have increasingly less proclivity to being etched by the particular gas that is used, the conical hole profile shown in FIG. 1 may result. Each layer 16a-16c may be etched at a different rate due to the different etch rate of the material forming each of the layers 16 in some embodiments. However, the present invention is not limited to any particular manufacturing technique. The above technique is given only for purposes of illustration.

The chalcogenide material 20 may be a material having electrical properties (e.g. resistance, capacitance, etc.) that may be changed through the application of energy such as, for example, heat, light, voltage potential, or electrical current. The chalcogenide material 20 may be a material that includes at least one element from column VI of the periodic table or may be a material that includes one or more of the chalcogen elements, e.g., any of the elements of tellurium, sulfur, or selenium.

Programming of material 20 to alter the state or phase of the material may be accomplished by applying voltage potentials to the electrodes 14 and 12, thereby generating a voltage potential across the chalcogenide material 20. When the voltage potential is greater than the threshold voltage of the cell 10, then an electrical current may flow through chalcogenide material 20 in response to the applied voltage potentials, and may result in heating of Chalcogenide material 20.

This heating may alter the memory state or phase of chalcogenide material 20. Altering the phase or state of chalcogenide material 20 may alter the electrical characteristic of chalcogenide material 20, e.g., the resistance of the material may be altered by altering the phase of the chalcogenide material 20.

In the "reset" state, chalcogenide material 20 may be in an amorphous or semi-amorphous state and in the "set" state, chalcogenide material 20 may be in an a crystalline or semi-crystalline state. The resistance of chalcogenide material 20 in the amorphous or semi-amorphous state may be greater than the resistance of chalcogenide material 20 in the crystalline or semi-crystalline state. It is to be appreciated that the association of reset and set with amorphous and crystalline states, respectively, is a convention and that at least an opposite convention may be adopted.

Using electrical current, chalcogenide material 20 may be heated to a relatively higher temperature to amorphosize all or part of the chalcogenide material 20 and "reset" chalcogenide material 20 (e.g., program chalcogenide material 20 to a particular logic value). Heating all or part of the volume of chalcogenide material 20 to a relatively lower crystallization temperature may crystallize chalcogenide material 20 and "set" chalcogenide material 20 (e.g., program chalcogenide material 20). Various resistances of chalcogenide material 20 may be achieved to store information by varying the amount of current flow and duration through the volume of chalcogenide material 20.

Suitable materials for the electrodes 12 and 14 may include a thin film of titanium nitride (TiN), titanium tungsten (TiW), carbon (C), silicon carbide (SiC), titanium aluminum nitride (TiAlN), titanium silicon nitride (TiSiN), polycrystalline silicon, tantalum nitride (TaN), some combination of these films, or other suitable conductors or resistive conductors compatible with switching material 24.

A system 500 may be any processor-based system including, for example, a laptop computer, a desktop computer, a server, a personal digital assistant, an imaging device, a cellular telephone, a set top box, an Internet appliance, a media player, or an embedded device to mention a few examples.

System 500 may include a controller 510, an input/output (I/O) device 520 (e.g. a keypad, display), a memory 530, and a wireless interface 540 coupled to each other via a bus 550. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory and/or a phase change including the cell 10.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A phase change memory comprising:
    a bottom electrode;
    a top electrode;
    a dielectric material having a pore, tapering inwardly in at least three distinct steps as the dielectric material extends from said bottom electrode; and
    a chalcogenide material between said electrodes.

2. The phase change memory of claim 1 wherein said material tapers inwardly in at least two discrete steps.

3. The phase change memory of claim 1 including at least two cylinders of chalcogenide material having a common axis, said cylinders having different cross-sectional areas.

4. The phase change memory of claim 3 including having three cylinders of different cross-sectional areas but having a common axis.

5. The phase change memory of claim 1 including a first material surrounding a first chalcogenide region and a second material surrounding a second chalcogenide region.

6. The phase change memory of claim 5 wherein said first and second chalcogenide regions have different cross-sectional areas.

7. The phase change memory of claim 6 including a first chalcogenide region of smaller cross-sectional area and a second chalcogenide region of larger cross-sectional area, a first material with a first heat transfer coefficient surrounding said first chalcogenide region and a second material having a coefficient of heat transfer lower than said first heat transfer coefficient surrounding said second chalcogenide region.

8. The phase change memory of claim 1 including cells having four programmable states including three amorphous states and one crystalline state.

9. The phase change memory of claim 8 including a chalcogenide material surrounded by three layers having different thermal transfer coefficients.

10. The phase change memory of claim 1 wherein said chalcogenide material includes three regions having distinctly different resistance values.

11. A phase change memory comprising:
a pair of spaced electrodes;
a dielectric material having a pore, said pore tapering inwardly as the material extends from one of said electrode to the other of said electrodes;and
a chalcogenide material between said electrodes, said material including:
a first chalcogenide region of smaller cross-sectional area and a second chalcogenide region of larger cross-sectional area, a first material with a first heat transfer coefficient surrounding said first chalcogenide region and a second material having a coefficient of heat transfer lower than said first heat transfer coefficient surrounding said second chalcogenide region.

12. The memory of claim 11 wherein said pore tapers from a top to a bottom electrode.

13. The memory of claim 11 including at least three different current densities along the length of said chalcogenide material.

14. The memory of claim 11 including a third chalcogenide region larger in cross-sectional area that said second chalcogenide region.

* * * * *

UNITED STATES PATENT AND TRADEMARK OFFICE
CERTIFICATE OF CORRECTION

PATENT NO. : 7,488,968 B2  Page 1 of 1
APPLICATION NO. : 11/122363
DATED : February 10, 2009
INVENTOR(S) : Jong-Won S. Lee It is certified that error appears in the above-identified patent and that said Letters Patent is hereby corrected as shown below:

Col. 4:
Line 52, before "tapering" insert --said port--;
Line 54, before "bottom" insert --top electrode to said--;

Col. 6:
Lines 2 and 3, "electrode" should be --electrodes--;
Line 3, "electrodes;and" should be --electrodes; and--.

Signed and Sealed this
Eleventh Day of September, 2012

David J. Kappos
*Director of the United States Patent and Trademark Office*